(12) United States Patent
Nefzi et al.

(10) Patent No.: US 12,287,587 B2
(45) Date of Patent: Apr. 29, 2025

(54) DAMPING ARRANGEMENT FOR VIBRATION DAMPING OF AN ELEMENT IN AN OPTICAL SYSTEM

(71) Applicant: Carl Zeiss SMT GmbH, Oberkochen (DE)

(72) Inventors: Marwene Nefzi, Ulm (DE); Stefan Hembacher, Bobingen (DE); David Schoenen, Aalen (DE); Jens Kugler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 239 days.

(21) Appl. No.: 17/983,070

(22) Filed: Nov. 8, 2022

(65) Prior Publication Data

US 2023/0104921 A1 Apr. 6, 2023

Related U.S. Application Data

(63) Continuation of application No. PCT/EP2021/054038, filed on Feb. 18, 2021.

(30) Foreign Application Priority Data

May 27, 2020 (DE) .......................... 102020206589.6

(51) Int. Cl.
*G03F 7/00* (2006.01)
*F16F 7/10* (2006.01)
*G02B 7/182* (2021.01)

(52) U.S. Cl.
CPC ............ *G03F 7/709* (2013.01); *F16F 7/1034* (2013.01); *G02B 7/182* (2013.01);
(Continued)

(58) Field of Classification Search
CPC ............ F16F 2222/08; F16F 2228/066; F16F 2230/00; F16F 7/1034; F16F 9/106;
(Continued)

(56) References Cited

U.S. PATENT DOCUMENTS 9,593,733 B2   3/2017  Hauf
2006/0126040 A1*  6/2006  Butler .................... F16F 9/003
                                                        355/53

(Continued)

FOREIGN PATENT DOCUMENTS

DE   10 2011 120 305 A1   6/2013
DE   10 2013 103 337 A1   10/2014
(Continued)

OTHER PUBLICATIONS

Translation of International Search Report for corresponding PCT Application No. PCT/EP2021/054038, dated Jun. 2, 2021.
(Continued)

*Primary Examiner* — Deoram Persaud
(74) *Attorney, Agent, or Firm* — Fish & Richardson P.C.

(57) ABSTRACT

The disclosure relates to a damping arrangement for vibration damping of an element in an optical system, for example in a microlithographic projection exposure apparatus. A damping arrangement according to the disclosure has an element, a fluid located in a cavity, and at least one channel connected to the cavity. A vibration of the element causes vibration energy of the element to be dissipated by partial displacement of the fluid from the cavity into the at least one channel.

22 Claims, 11 Drawing Sheets

(52) U.S. Cl.
CPC ..... *F16F 2222/08* (2013.01); *F16F 2228/066* (2013.01); *F16F 2230/00* (2013.01)

(58) Field of Classification Search
CPC .. F16F 9/504; F16F 9/532; F16F 9/535; F16F 9/06; G02B 7/00; G02B 7/182; G02B 27/646; G02B 7/02; G03F 7/709; G03F 7/70825; G03F 7/70833; C23C 14/042; C23C 14/56; H01L 21/67259; H01L 21/67742; H01L 21/68; H01L 21/68707; H10K 71/166; H04L 2209/56; H04L 2209/80; H04L 63/0209; H04L 63/0853; H04L 9/30; H04L 9/3228; H04L 9/3239; H04L 9/3247; H04L 9/3271; H04L 9/50
See application file for complete search history.

(56) References Cited

U.S. PATENT DOCUMENTS

| | | | | |
|---|---|---|---|---|
| 2009/0180091 | A1* | 7/2009 | Farnsworth | F16F 9/06 355/72 |
| 2013/0155385 | A1* | 6/2013 | Hashemi | G03F 7/70841 355/76 |
| 2014/0202812 | A1* | 7/2014 | Hauf | G03F 7/709 188/380 |
| 2017/0221674 | A1* | 8/2017 | Van Veen | H01J 37/16 |
| 2017/0227084 | A1 | 8/2017 | Ditzel et al. | |
| 2024/0176255 | A1* | 5/2024 | Van De Meerendonk | G03F 7/70875 |

FOREIGN PATENT DOCUMENTS

| | | |
|---|---|---|
| DE | 10 2015 104 781 B4 | 9/2016 |
| DE | 102015223980 A1 | 10/2016 |
| DE | 10 2016 001 507 A1 | 8/2017 |
| JP | H-1144834 A | 2/1999 |
| WO | WO 2009/062606 A1 | 5/2009 |

OTHER PUBLICATIONS

International Preliminary Report, with translation thereof, for corresponding PCT Application No. PCT/EP2021/054038, dated Dec. 8, 2022.

GPTO-Office Action, with translation thereof, for corresponding DE 10 2020 206 589.6, dated Nov. 30, 2020.

* cited by examiner

DAMPING ARRANGEMENT FOR VIBRATION DAMPING OF AN ELEMENT IN AN OPTICAL SYSTEM

CROSS-REFERENCE TO RELATED APPLICATIONS

The present application is a continuation of, and claims benefit under 35 USC 120 to, international application PCT/EP2021/054038, filed Feb. 18, 2021, which claims benefit under 35 USC 119 of German Application No. 10 2020 206 589.6, filed May 27, 2020. The entire disclosure of these applications are incorporated by reference herein.

FIELD

The disclosure relates to a damping arrangement for vibration damping of an element in an optical system, for example in a microlithographic projection exposure apparatus.

BACKGROUND

Microlithography is used for producing microstructured components, such as for example integrated circuits or LCDs. The microlithography process is carried out in what is known as a projection exposure apparatus, which includes an illumination device and a projection lens. The image of a mask (=reticle) illuminated via the illumination device is projected in this case via the projection lens onto a substrate (for example a silicon wafer) that is coated with a light-sensitive layer (photoresist) and arranged in the image plane of the projection lens in order to transfer the mask structure to the light-sensitive coating of the substrate.

In a projection exposure apparatus designed for EUV (i.e. for electromagnetic radiation with a wavelength below 30 nm, for example below 15 nm), mirrors are used as optical components for the imaging process due to the general lack of light-transmissive materials.

During the operation of a projection exposure apparatus, for example in EUV systems, mechanical disturbances caused by vibrations can have a negative effect on the positional stability of the components (such as EUV mirrors) of the system and the optical performance of the system. Weakly damped mechanical resonances in the system can lead to an excessive local increase in the interference spectrum in the range of the resonant frequencies and to an associated deterioration in the positional stability of passively mounted components and also of actively closed-loop controlled components. Furthermore, resonances can lead to instability of the control loop in the case of closed-loop controlled systems.

Since the (e.g. metallic or ceramic) materials permitted in EUV systems with regard to the desired vacuum resistance themselves generally have only low intrinsic damping, further damping measures are used to overcome or mitigate the abovementioned problems.

Various damping concepts are known, with reference being made to U.S. Pat. No. 9,593,733 B2 merely by way of example.

SUMMARY

The present disclosure seeks to provide a damping arrangement for vibration damping of an element in an optical system, for example in a microlithographic projection exposure apparatus, which allows effective damping with a compact design even in the case of higher-frequency vibration excitations.

A damping arrangement for vibration damping of an element in an optical system comprises: an element; a fluid located in a cavity; and at least one channel connected to the cavity, wherein a vibration of the element causes vibration energy of the element to be dissipated by partial displacement of the fluid from the cavity into the at least one channel.

The disclosure involves the concept of realizing energy dissipation for vibration damping of an element (such as an EUV mirror, for example) by virtue of a fluid located in a cavity being used in such a way that the vibration of the element to be damped is accompanied by a partial displacement of this fluid into a channel connected to the cavity. The liquid displacement that takes place in the channel can have the consequence that—as a result of the increase in energy dissipation due to the friction occurring on the channel wall—efficient damping can also be achieved if the fluid itself has only a low or medium viscosity (so that e.g. water can also be used as a fluid).

Furthermore, the increase in energy dissipation achieved through the channel can have the consequence that—depending on the magnitude of the (resonant) frequency of the respective element to be damped—the further use of an absorber mass or auxiliary mass is either unnecessary or can be limited to significantly lower masses (in comparison with a fluid-based energy dissipation without the displacement according to the disclosure into a channel). Consequently, among other things, the installation space for the damping arrangement can in turn be significantly reduced and, as a result, a relatively compact system design can be implemented.

For the purposes of the present application, a "channel" is understood to mean an elongated hollow structure whose length can be at least five times, for example at least ten times, the average diameter.

According to one embodiment, the damping arrangement has located inside the cavity at least one auxiliary mass which partially displaces the fluid into the at least one channel when the element vibrates.

According to one embodiment, this auxiliary mass is stably mounted with respect to the element.

According to one embodiment, the stable mounting of the auxiliary mass has a resonant frequency that matches a resonant frequency of the element that is to be damped.

However, the disclosure is not limited to the use of such an auxiliary mass. Depending on the magnitude of the (resonant) frequency of the element to be damped, it may thus also be sufficient to use only the fluid that is located in the cavity itself or its vibrating mass proportion for vibration damping. In this case, this vibrating mass proportion of the fluid can be matched to the resonant frequency of the optical element to be damped.

According to one embodiment, the damping arrangement is designed for damping a resonant frequency of the element of more than 50 Hz, for example of more than 100 Hz, such as more than 500 Hz.

According to one embodiment, the damping arrangement has a plurality of auxiliary masses which are located within the cavity and partially displace the fluid into the at least one channel when the element vibrates.

The use of a plurality of "counter-vibrating" auxiliary masses or particles located within the cavity has for example the advantage that a spatial distribution of the achieved damping effect is achieved (in comparison with pointwise damping), which means that particularly effective damping can be achieved even with comparatively complex geometries of the element to be damped in each case.

According to one embodiment, the at least one channel forms a cooling channel for cooling the element during operation of the optical system.

In this way, a dual functionality of the fluid according to the disclosure can be realized in that the fluid brings about a cooling effect (for example to compensate for thermal loads occurring during operation of the element or of an optical system having said element) in addition to the energy dissipation described above. Here, the disclosure can for example also make use of the abovementioned fact that, according to the disclosure, even a fluid with only medium viscosity (e.g. cooling water) can be used for vibration damping.

According to one embodiment, the at least one channel has a meandering geometry at least in regions.

According to one embodiment, the damping arrangement furthermore has at least one magnet and/or at least one coil to which electric current may be supplied.

According to one embodiment, the element is an optical element, for example a mirror.

In further embodiments, the element can also be, for example, an actuator component or a supporting or measurement frame.

The disclosure furthermore relates to a projection exposure apparatus with at least one damping arrangement according to the disclosure. The projection exposure apparatus can be designed for example for operation in the EUV or for operation at a working wavelength of less than 30 nm, for example of less than 15 nm. In other applications, the projection exposure apparatus can also be designed for operation in the VUV range, for example for wavelengths of less than 200 nm, for example less than 160 nm.

Further configurations of the disclosure are evident from the description and the dependent claims.

The disclosure is explained in greater detail below on the basis of exemplary embodiments illustrated in the accompanying figures.

DETAILED DESCRIPTION

A damping arrangement in accordance with a first embodiment of the disclosure is explained initially below with reference to FIGS. 1A-1B. The damping arrangement according to FIG. 1A serves for dissipating vibration energy of an element in an optical system, for example in a microlithographic projection exposure apparatus.

In the application examples described below, the element to be damped with regard to vibrations (not shown in FIG. 1A) is a mirror, which forms a vibrating mass-spring system with a specified resonant frequency in relation to a supporting structure. However, the disclosure is not limited to this. In other applications, the element to be damped with regard to vibrations can also be, for example, an actuator component of an actuator used to actuate such an optical element, a joint element, a reaction or filter mass or any desired structural element, for example a supporting or measurement frame.

Figure 1A:
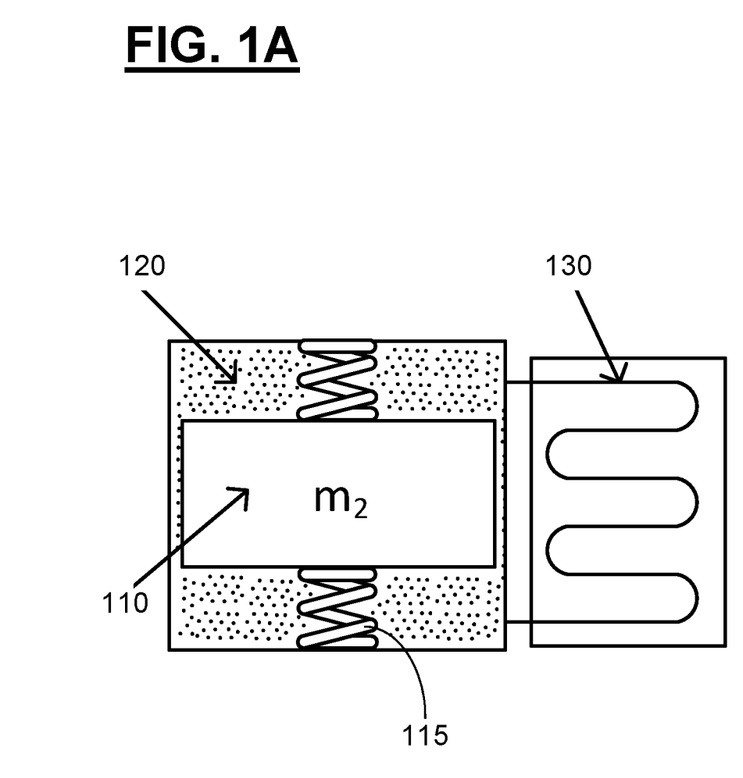
FIGS. 1A-1B show schematic illustrations to explain the basic structure and the function of a damping arrangement according to the disclosure in accordance with one embodiment.

As can be seen from FIG. 1A, the damping arrangement according to the disclosure has, for example, a fluid 120 located within a cavity and a channel 130 connected to the cavity. For its part, the cavity can be provided in the element to be damped or can also be formed separately therefrom (e.g. in a housing enclosing the cavity). Furthermore, according to FIG. 1A, an auxiliary mass 110 is located within the cavity, wherein the value of the mass of this auxiliary mass is $m_2$ and wherein stable mounting of the auxiliary mass 110 is symbolized by a spring denoted by "115."

The functional principle of the damping arrangement of FIG. 1A is that a vibration of the element to be damped in terms of its vibration energy causes the fluid 120 to be partially displaced into the channel 130 connected to the cavity, resulting in energy dissipation and an associated damping effect. According to the disclosure, this energy dissipation is increased by said fluid displacement into the channel 130 with the result that vibration damping of comparatively high resonant frequencies of the relevant element to be damped for example of more than 50 Hz (for example more than 100 Hz, such as more than 500 Hz) can be achieved even when using a fluid 120 of only medium or low viscosity and/or with a comparatively low value of the mass $m_2$ of the auxiliary mass 110.

For example, water can be used as the fluid 120, for example. In further embodiments, however, highly viscous liquids such as, for example, water silicones, silicone oils, magnetorheological liquids or ferrofluids can also be used as the fluid 120.

Depending on the specific application or magnitude of the resonant frequency to be damped, the use of an auxiliary or absorber mass 110 may also be dispensed with entirely, in that only the fluid 120 itself (which then does not completely fill the cavity) or its vibrating mass is used for the energy dissipation.

The at least one channel 130 used according to the disclosure to increase the energy dissipation can for example have a meandering geometry, as indicated in FIG. 1A. Such a geometry is advantageous for achieving a high level of friction or energy dissipation on the channel wall, while the design is simultaneously relatively compact. However, the disclosure is not limited to this, so that embodiments with any other channel design or geometry should also be considered to be covered by the disclosure.

Suitable (joining) technologies for implementing the channel 130 in the damping arrangement according to the disclosure (e.g. within the element to be damped or a frame structure) comprise, for example, silicate bonding, fusion bonding, and direct bonding.

Figure 1B:
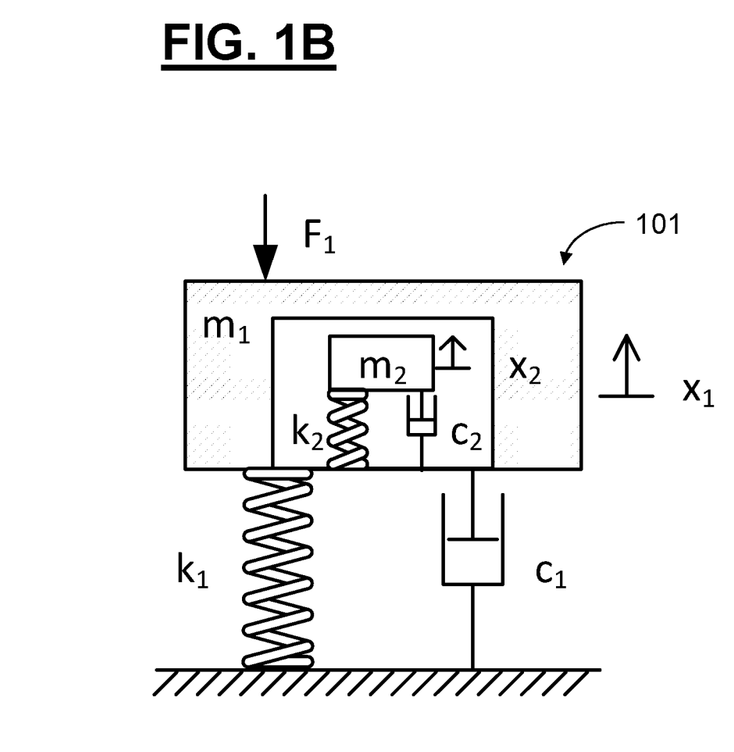

To further explain the function, FIG. 1B shows an equivalent circuit diagram for the damping arrangement explained above with reference to FIG. 1A, wherein the element 101 that is to be damped with regard to its vibration and is here additionally drawn has a mass $m_1$ and the auxiliary mass 110 has a mass $m_2$. Furthermore, the disturbance force acting on the element 101 to be damped with regard to vibrations is denoted by $F_1$, and the movement of this element 101 or of the mass $m_1$ to be damped is denoted by $x_1$.

The transfer function from the disturbance force, $F_1$, to the movement, $x_1$, of the mass to be damped is $$H(s) = \frac{X_1(s)}{F_1(s)} = \frac{(m_2 s^2 + c_2 s + k_2)}{(m_1 m_2)s^4 + (c_2 m_1 + c_2 m_2)s^3 + (k_1 m_2 + k_2 m_1 + k_2 m_2)s^2 + (c_2 k_1)s + k_1 k_2} \quad (1)$$

Starting from equation (1), the degree of damping $c_2$ to achieve optimal damping of the mass $m_1$ can be determined according to table 1 below.

TABLE 1

| | |
|---|---|
| Mass of the mirror | $m_1$ |
| Mass of the damper | $m_2$ |
| Mass ratio | $\mu = \dfrac{m_2}{m_1}$ |
| Mode to be damped | $f_1$ |
| Structural damping | $\zeta_1$ |
| Optimum frequency of the auxiliary mass in the viscous fluid | $f_2 = \dfrac{f_1}{1+\mu}$ |
| Optimum degree of damping of the auxiliary mass in the viscous fluid | $\zeta_2 = \sqrt{\dfrac{3\mu}{8(1+\mu)^3}}$ |
| Viscous damping of the auxiliary mass | $C_2 = 2 m_2 \zeta_2 \omega_2$ |
| Channel length to achieve the desired damping | $l = \dfrac{c_2}{8\pi \eta_2}$ |

Figure 2A:
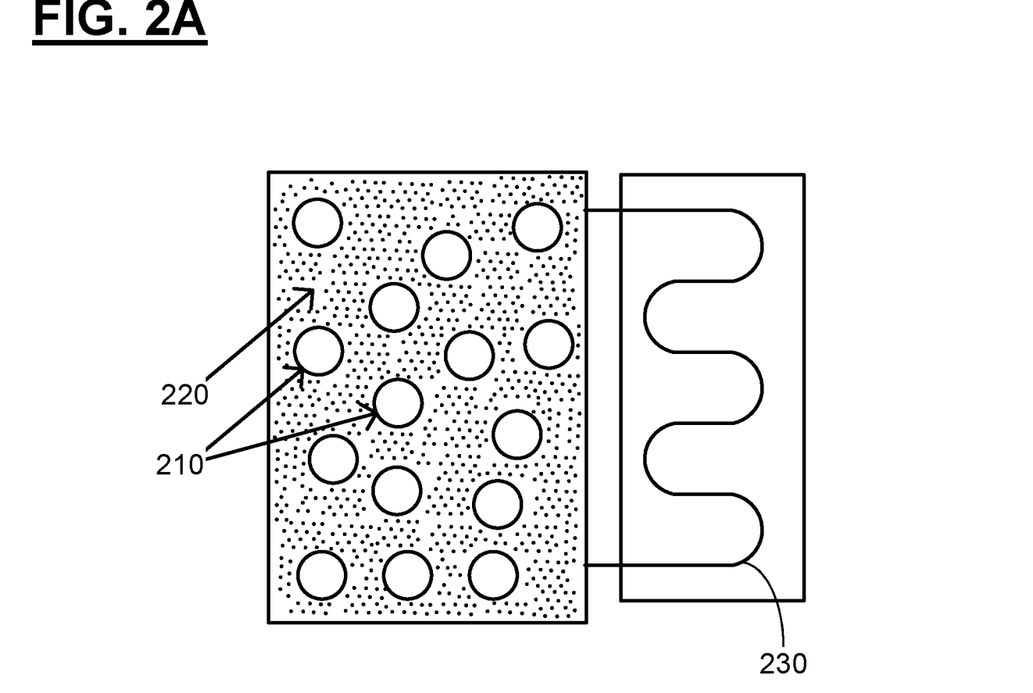
FIGS. 2A-2B show schematic illustrations to explain embodiments of a damping arrangement according to the disclosure.
Figure 2B:
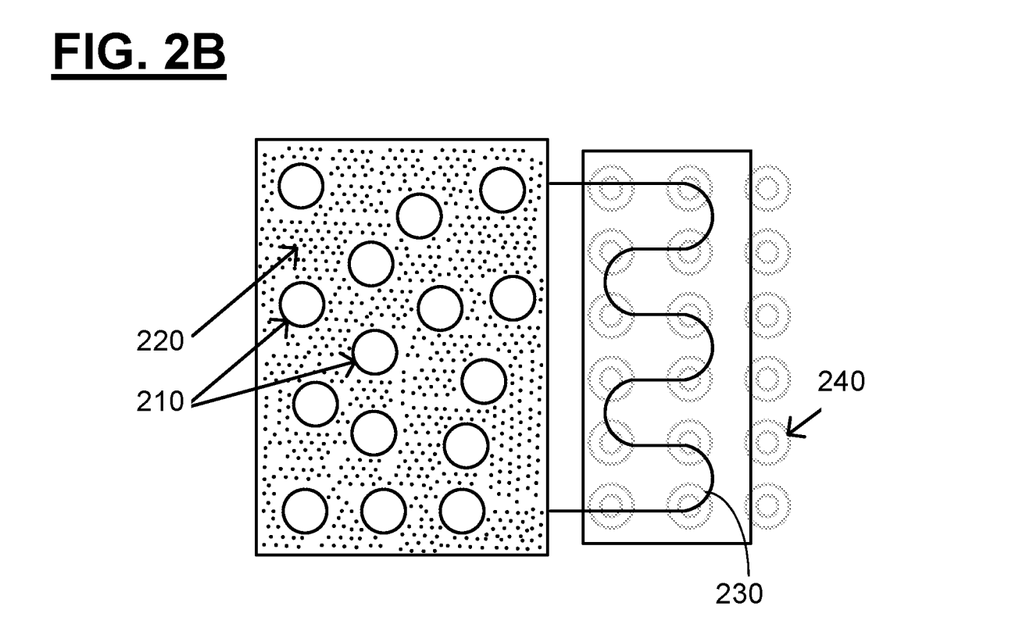

FIGS. 2A-2B show schematic illustrations to explain further embodiments of the disclosure, wherein components that are analogous or substantially have the same function in comparison with FIG. 1 are denoted by reference numbers increased by "100". According to FIG. 2A, rather than providing just a single auxiliary mass 110, a plurality of auxiliary masses 210 can also be provided inside the cavity connected to the channel 230. Such a configuration has for example the advantage that instead of pointwise damping, a spatial distribution of the damping effect is achieved with the result that an effective damping effect can be achieved even for comparatively complex shapes of the respective element to be damped with regard to vibrations.

Furthermore, as indicated in FIG. 2B, a further increase in the energy dissipation achieved can also be achieved by generating a magnetic field (indicated by field lines 240) via permanent magnets or via coils to which electric current is supplied, wherein the viscosity of the fluid 220 can be increased at the same time by using e.g. magnetorheological particles or ferrofluids.

Additionally or alternatively, an increase in the energy dissipation can also be achieved by mounting one or more orifice plates inside the cavity and/or inside the channel connected to the cavity.

Figure 3:
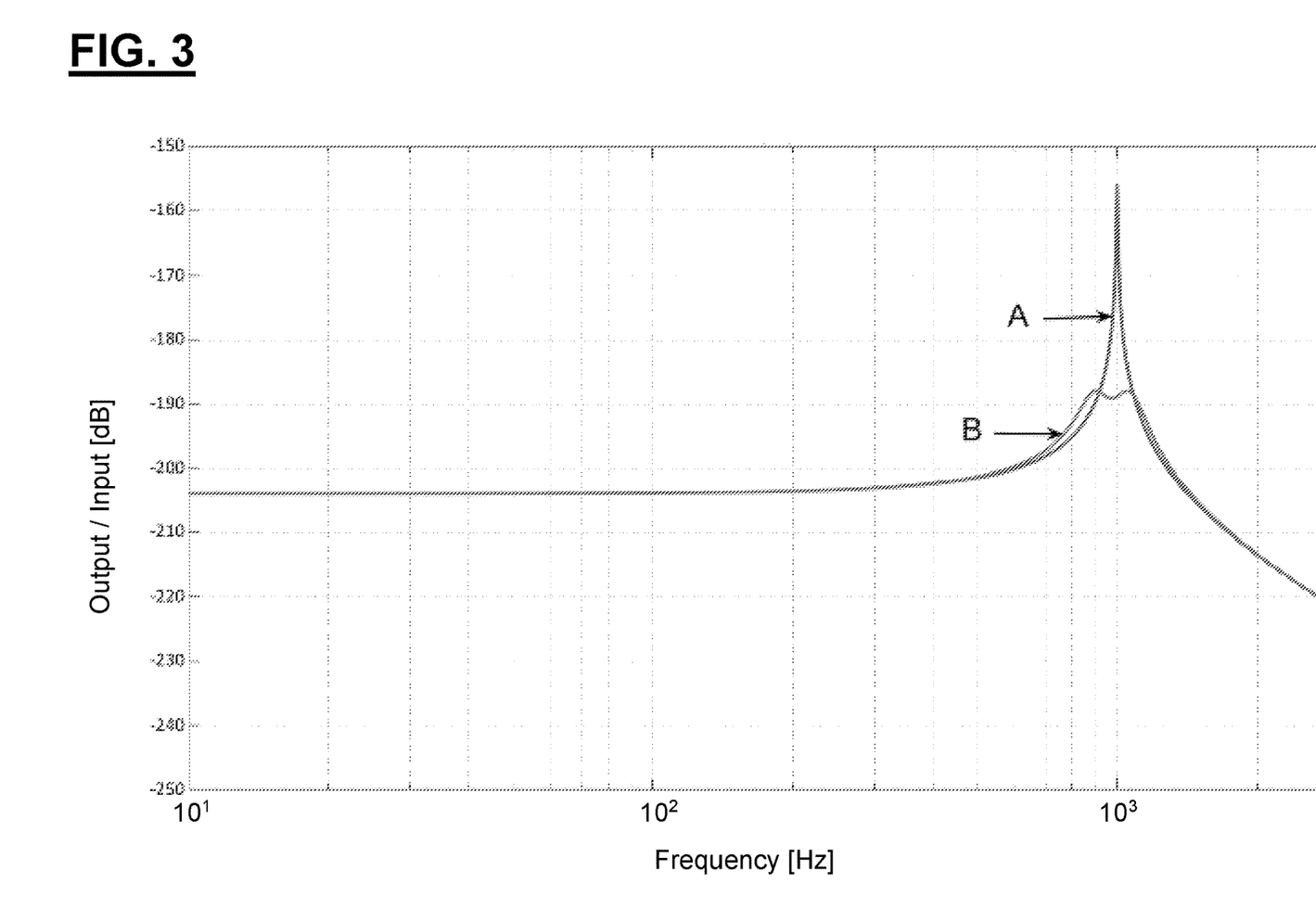
FIG. 3 shows a diagram to explain vibration suppression that is achievable by way of example with a damping arrangement according to the disclosure.

FIG. 3 shows a diagram for the transfer function to explain a possible example of a damping effect achieved with the damping arrangement according to the disclosure.

In the exemplary embodiment shown, the element to be damped with regard to vibrations exhibits an undesirable resonance at a frequency of approximately 1000 Hz (=curve "A"), wherein significant suppression (=curve "B") is achieved for this resonant frequency according to the disclosure.

Table 2 shows quantitative data for one possible exemplary embodiment. The fluid with a suitable dynamic viscosity can in this case be a commercially available water silicone (e.g. available under the name Wacker® 1000000).

TABLE 2

| | |
|---|---|
| Mass of the mirror | 350 kg |
| Mass of the auxiliary mass | 17.5 kg |
| Mode to be damped | 800 Hz |
| Structural damping of the mirror | 0.1% |
| Optimum frequency of the auxiliary mass in the viscous fluid | 761 Hz |
| Viscous damping | $2.2 \ast 10^4$ Ns/m |
| Assumed dynamic viscosity of the fluid | $1 \ast 0^4$ Pa s |
| Tube length to achieve the desired energy dissipation | $l = \dfrac{c_2}{8\pi \eta_2} = 80$ mm |

Figure 4:
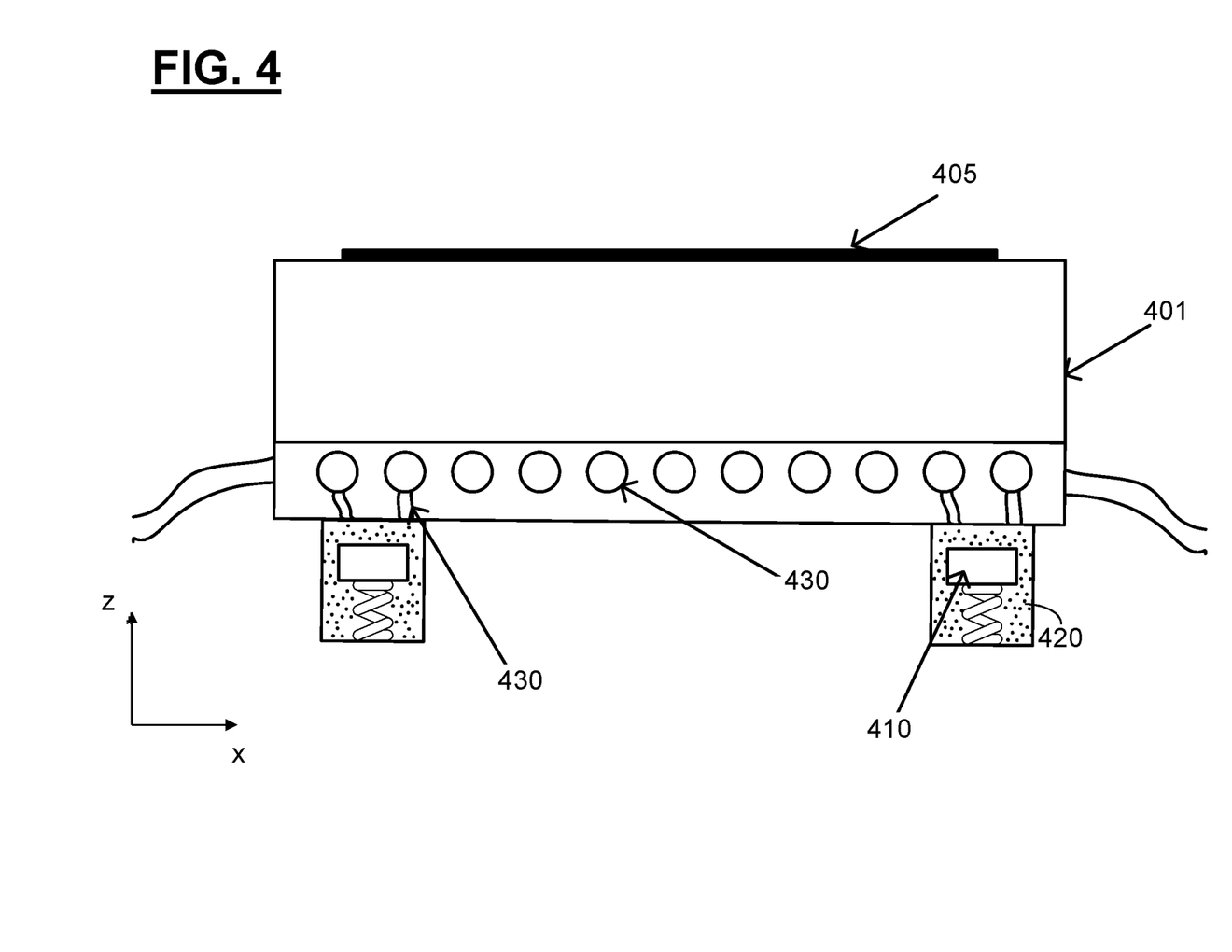
FIGS. 4-6 show schematic illustrations to explain embodiments of a damping arrangement according to the disclosure.

FIG. 4 shows a schematic illustration to explain a further possible embodiment of a damping arrangement according to the disclosure, wherein components that are analogous or substantially have the same function in comparison with FIG. 1 are denoted by reference signs increased by "300." The element to be damped with regard to vibrations is also shown in FIG. 4 and denoted by "401." This can be an EUV mirror with an optically effective surface 405, for example.

In the embodiment of FIG. 4, the channels 430 that are used according to the disclosure to increase the energy dissipation (and are each connected to a cavity receiving a fluid 420 analogously to the embodiments described above) form additional cooling channels for the element 401 to be damped or the EUV mirror. In other words, in this embodiment, the fluid 420 (e.g. water) used for energy dissipation also assumes the function of a cooling fluid in order to compensate thermal loads occurring (e.g. as a result of electromagnetic radiation being incident on the EUV mirror) for instance during the operation of the element 401 or EUV mirror.

Figure 5:
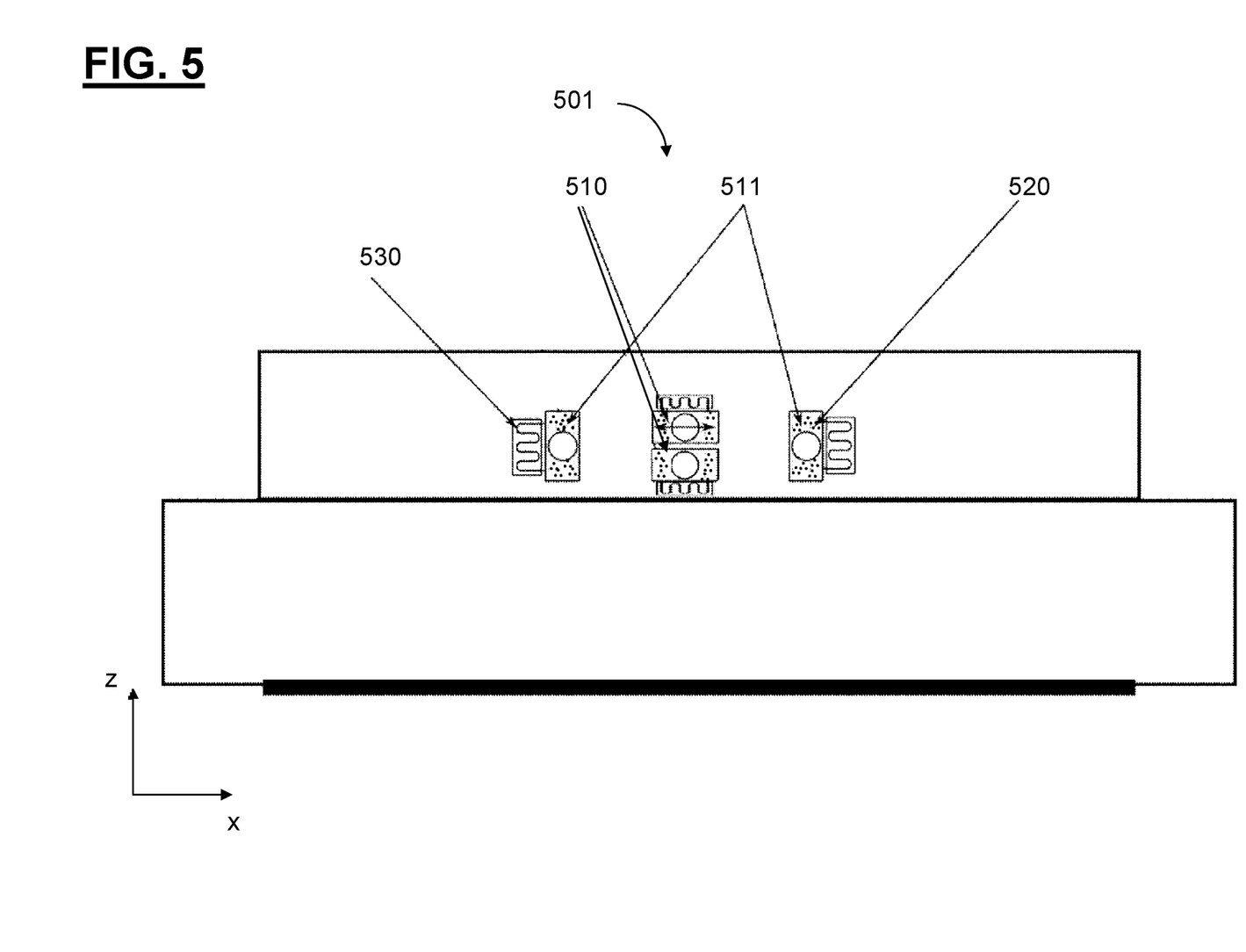
Figure 6:
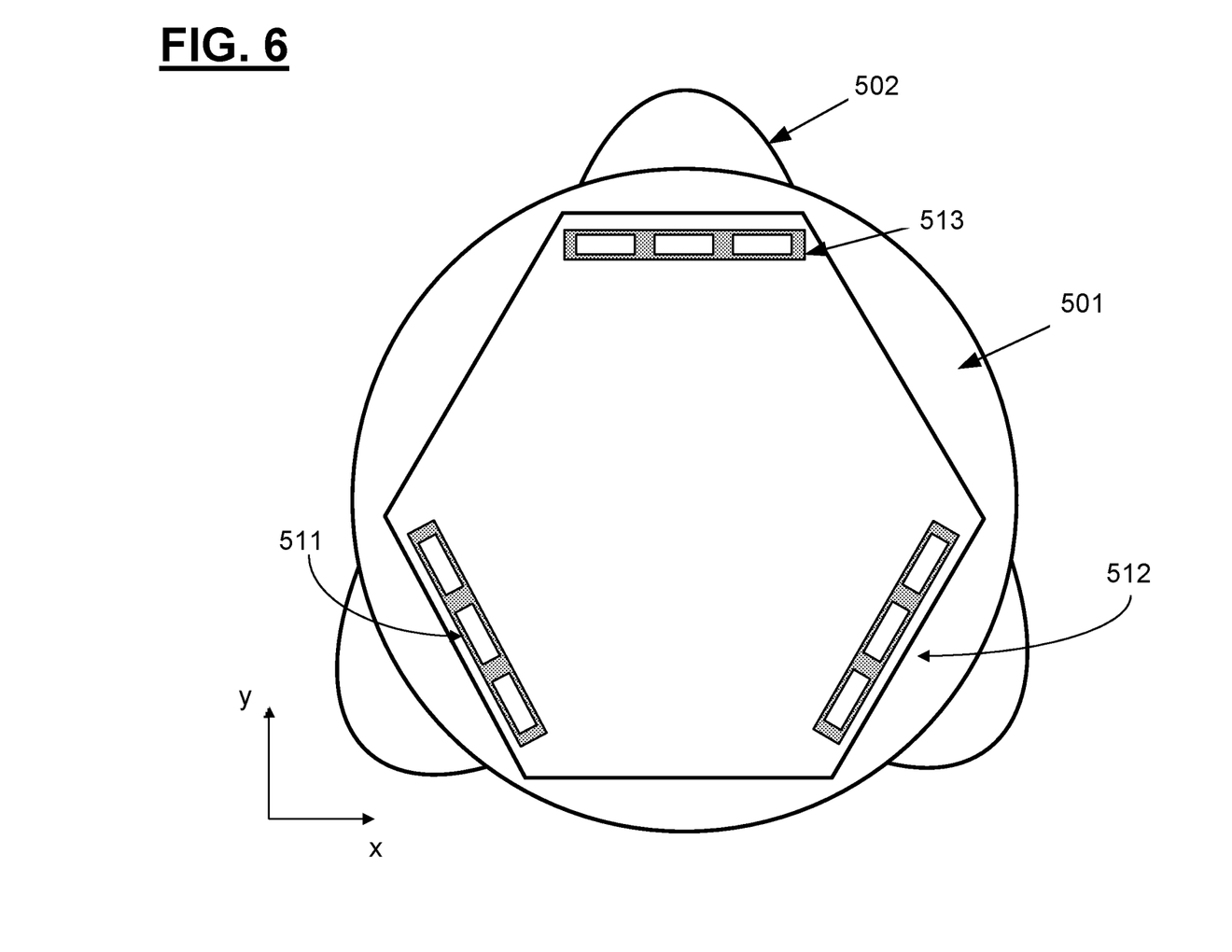

FIGS. 5-6 show one possible application scenario for a damping arrangement according to the disclosure, wherein components that are analogous or have substantially the same function in comparison with FIG. 1 are denoted by reference signs increased by "400." The element 501 to be damped with regard to vibrations is shown in FIG. 5 in a perspective view and in FIG. 6 in a plan view. In FIG. 6, a mechanical suspension of the element 501 is furthermore indicated and denoted by "502."

According to FIGS. 5-6, four auxiliary masses are used in each case in three regions that are azimuthally offset to one another in the circumferential direction (evident from FIG. 6) in such a way that in each of these three azimuthally offset regions (in which according to FIG. 6 in each case a damping element 511, 512 and 513 is formed by the stated auxiliary masses) vibrations are damped in two vibration directions in each case. Of the auxiliary masses stated, two auxiliary masses (denoted by "510" in FIG. 5) vibrate in the x-direction for each of the three azimuthally offset regions or for each of the damping elements 511, 512 and 513 and the other two auxiliary masses (denoted by "511" in FIG. 5) vibrate in the z-direction. Overall, vibration damping in six degrees of freedom is achieved in this way. The auxiliary masses 510, 511 each have a natural frequency which corresponds to a resonant frequency of the element or mirror 501 to be damped. Furthermore, the energy dissipation takes place analogously to the above-described embodiments by displacing in each case a fluid 520 surrounding the respective auxiliary mass 510, 511 into a channel 530 (here also designed by way of example in a meandering manner).

Embodiments are described below with reference to FIGS. 7-10, in which damping of low-frequency vibrations (typically with a frequency of less than 10 Hz) is to be realized. For example, the disturbance excitations to be damped according to these embodiments can be shock excitations, which can occur, for example, during transport or handling of the element to be damped or of the associated system (e.g. a projection lens) or also during an earthquake. In the case of such low-frequency disturbance excitations, according to the embodiments of FIGS. 7-10, the previously described amplification of the energy dissipation by the fluid displacement into at least one channel and/or the use of a highly viscous fluid can optionally be dispensed with.

Figure 7:
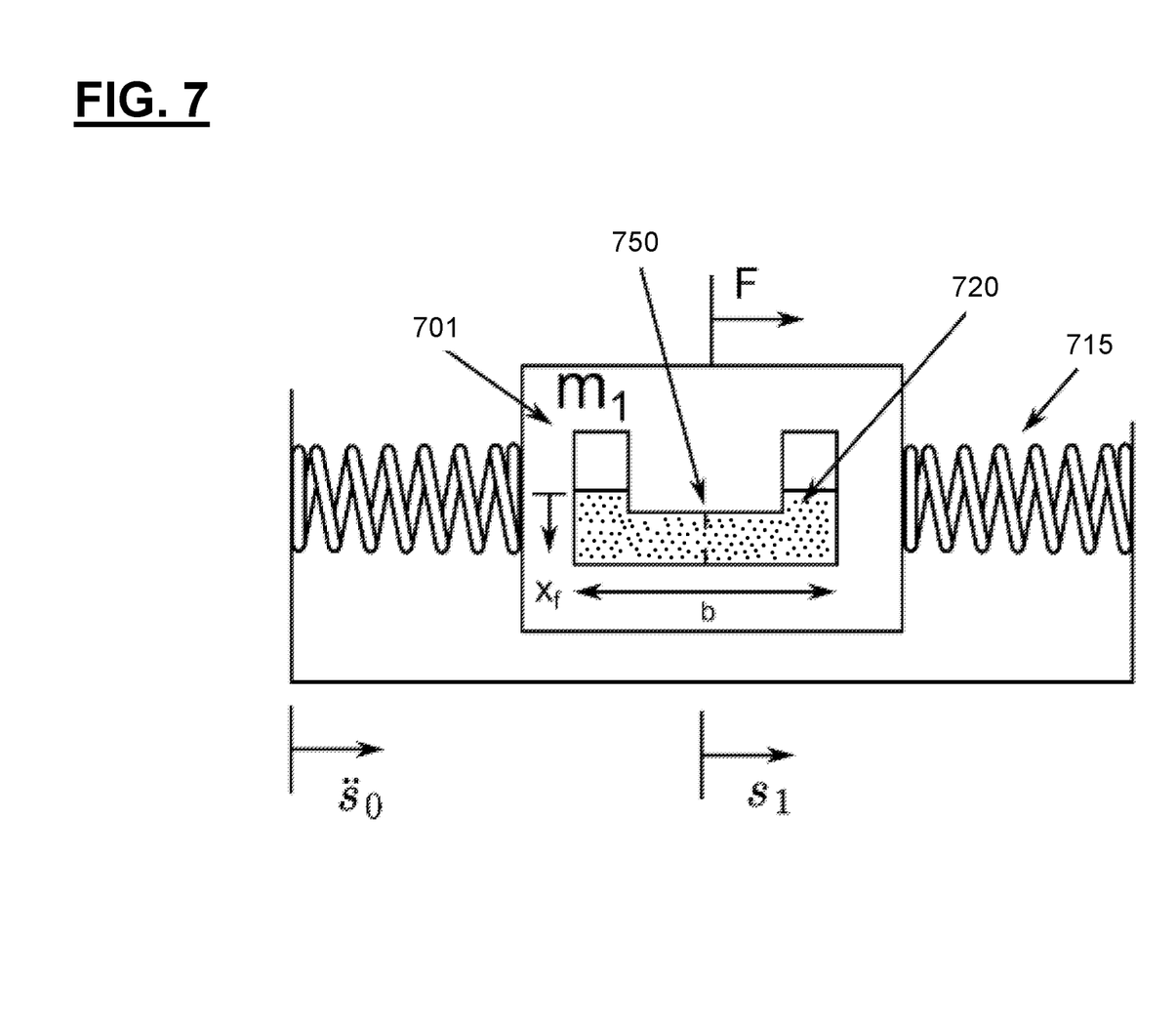
FIGS. 7-10 show schematic illustrations to explain embodiments of a damping arrangement for damping comparatively low-frequency vibrations.

FIG. 7 shows a schematic illustration of an embodiment, in which a fluid 720 used for to energy dissipation is arranged in a cavity located within the element 701 to be damped which has the mass $m_1$. A disturbance force acting on the element 701 or on its mass $m_1$ is denoted by "F." The natural frequency of the element 701 (as a rigid body) is of the order of 1 Hz here. The rigidity of the suspension of the element 701 or of the corresponding actuator units is symbolized by a spring 715. Rather than the channel present in each case in the above-described embodiments, merely one orifice plate 750 is used in the embodiment of FIG. 7 to increase the energy dissipation, wherein the energy dissipation is otherwise achieved by the fluid 720 itself, which for this purpose does not completely fill the cavity and therefore can effect corresponding counter-vibrations inside the cavity when the element 701 is excited to vibrate in order to realize the energy dissipation.

Since, therefore, according to the embodiment of FIG. 7, the use of an additional absorber mass in the form of a rigid body is dispensed with, the mass $m_2$ that is relevant for vibration damping or energy dissipation is here that of the fluid 720 effecting the corresponding counter-vibration.

Figure 8:
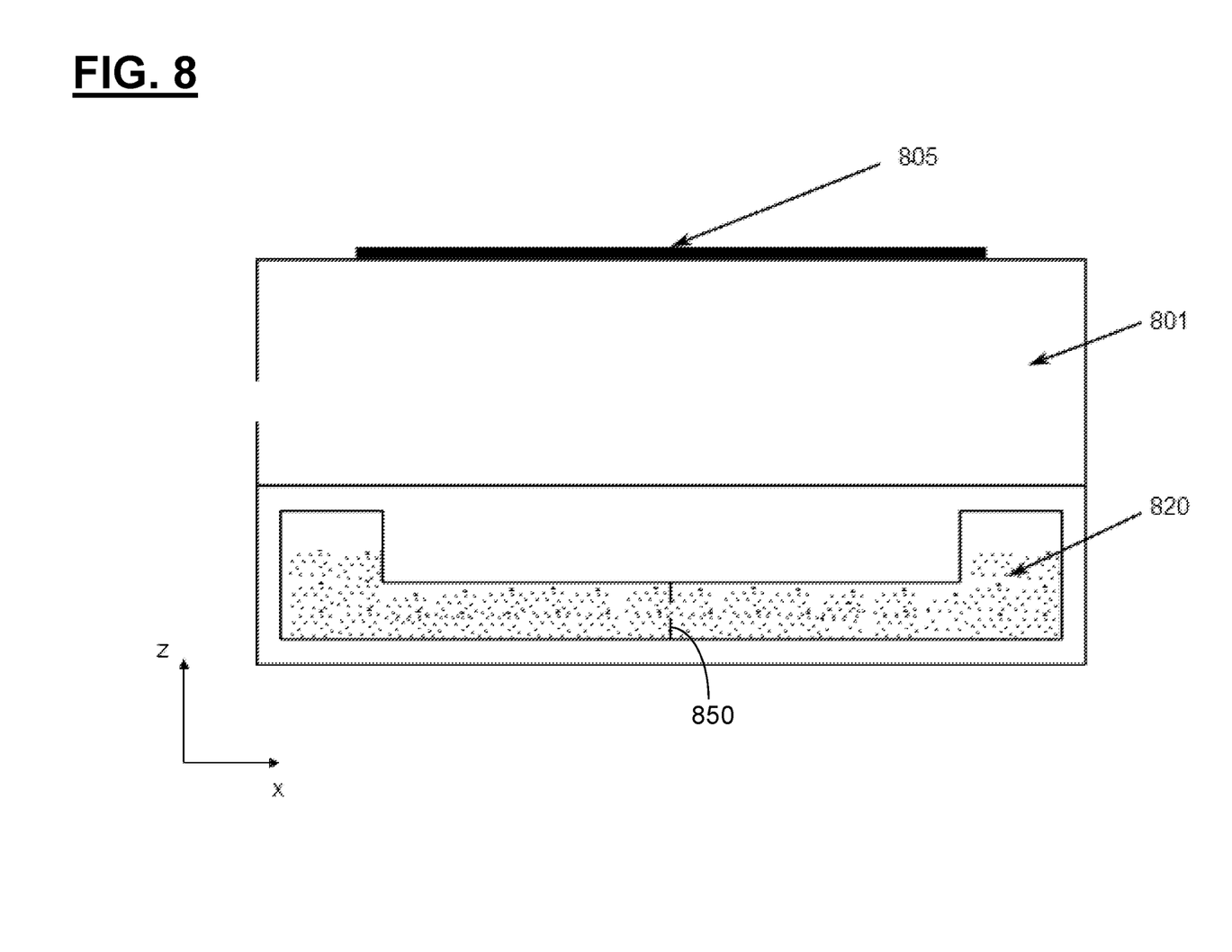

FIG. 8 shows a schematic illustration of the use of a damping arrangement with the functional principle described above with reference to FIG. 7 in a mirror, forming the element 801 to be damped, with an optically effective surface 805, wherein an orifice plate used to increase the energy dissipation is denoted by "850." "820" denotes the fluid which is forced through the orifice(s) in the orifice plate 850 with energy dissipation when the element 801 to be damped is excited by a shock.

Figure 9:
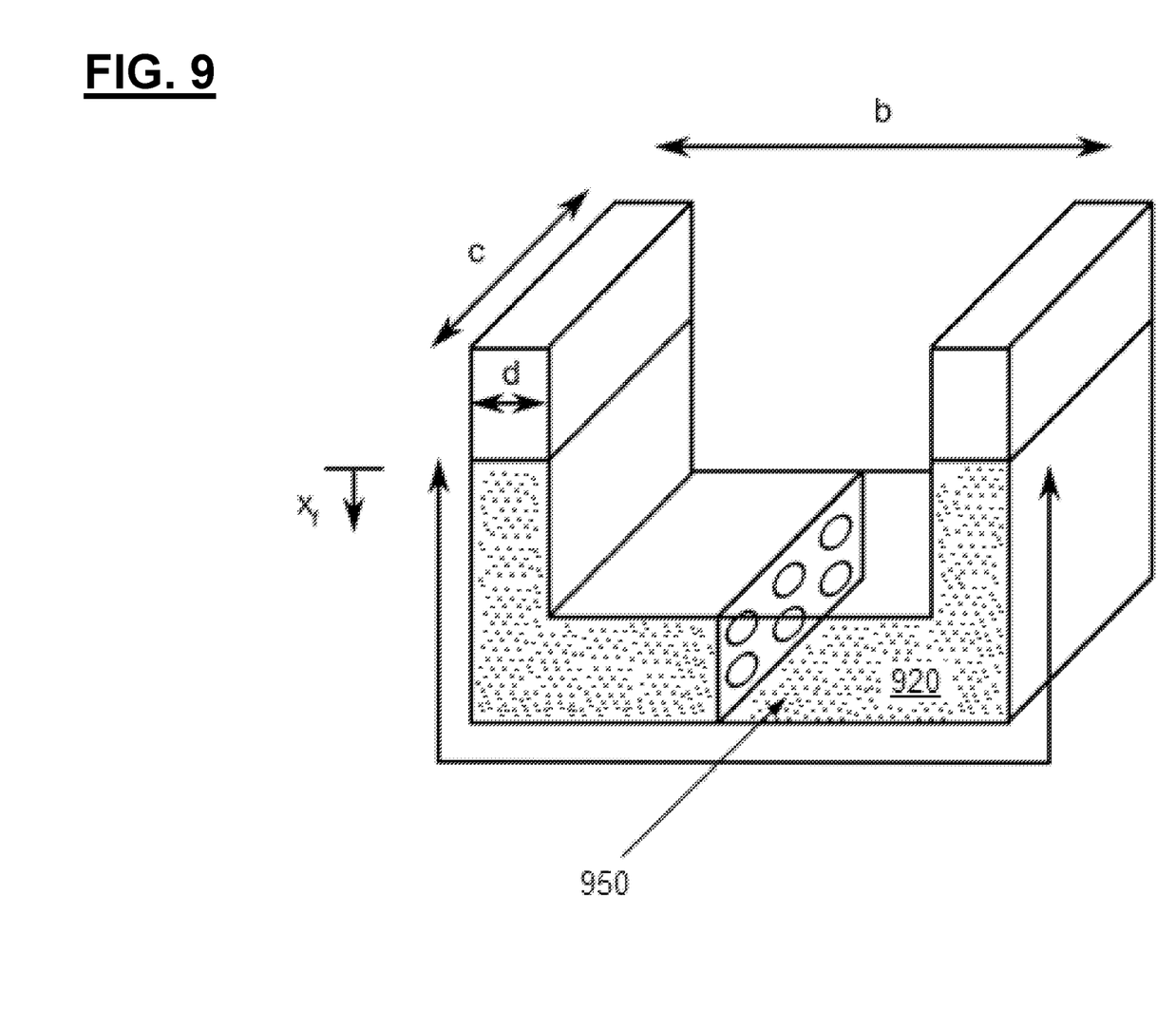

According to FIG. 9, such an orifice plate 950 used to increase the energy dissipation can also have a plurality of orifices or holes, wherein increased energy dissipation is achieved in this case when the fluid 920 passes through the orifices or holes.

The liquid movement within the optical element can be described by the following differential equation $$\rho A l \ddot{x}_f + \frac{1}{2}\rho A \xi |\dot{x}_f|\dot{x}_f + 2\rho A g x_f = -\rho A b \ddot{s}_1 \quad (2)$$

wherein $x_f$ is the radial coordinate along the liquid line, $\rho$ is the density of the liquid, and $A = c \cdot d$ is the total cross-sectional area of the channel. The meaning of the parameters c and d is evident from FIG. 9. $\xi$ refers to the loss factor of the orifice plate 950, which depends on the geometry of the orifice plate. g is the gravitational acceleration. The movement of the mass $m_1$ can be described by $$(m_1+\rho A l)\ddot{s}_1 + \rho A b \ddot{x}_f + k_a s_1 = F \quad (3)$$

wherein F denotes the disturbance force acting on the mass $m_1$.

Table 3 shows quantitative data for one possible exemplary embodiment.

TABLE 3

| Parameter | Value |
| --- | --- |
| Mass of the mirror | 150 kg |
| Stiffness of the actuator unit | $1.8 * 10^4$ N/m |
| Rigid body natural frequency of the mirror | 1.8 Hz |
| Length l | 300 mm |
| Width b | 285 mm |
| Depth c | 250 mm |
| Thickness d | 50 mm |
| Loss coefficient of the orifice plate | 50 |
| Density of the liquid | 997 kg/m³ |
| Mass of the liquid | 3.7 kg |
| Natural frequency of the liquid column | 1.3 Hz |
| External acceleration excitation | 1 g*m/s² |
| Degree of damping | approx. 4% |

Figure 10:
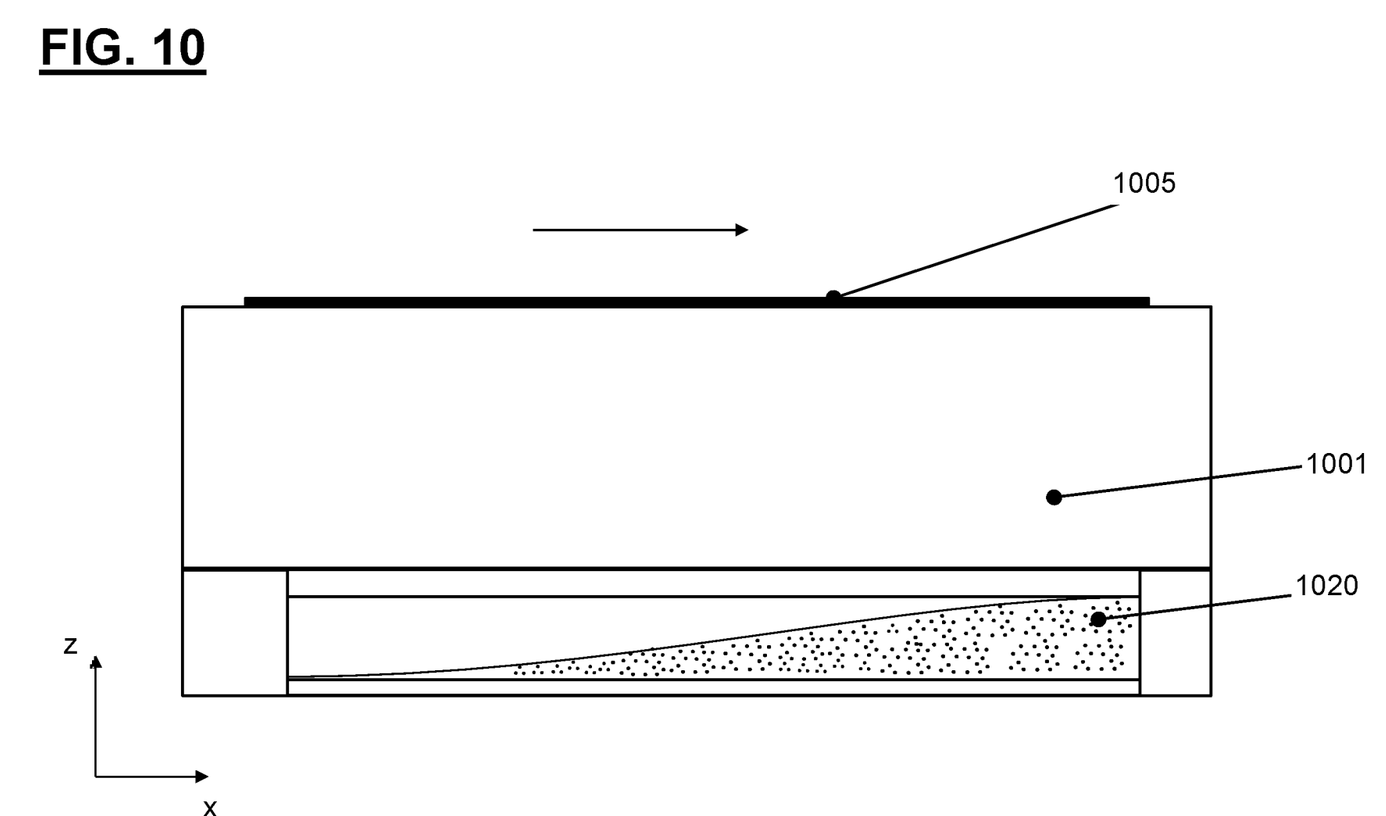

According to FIG. 10—depending on the magnitude of the (resonant) frequency to be damped—it is also possible for only the fluid (denoted by "1020" in FIG. 10) located within the cavity to be used for vibration damping, without an orifice plate being used. The element to be damped with regard to vibrations is denoted here by "1001." The arrow symbolizes the direction of a possible shock excitation to be damped.

Figure 11:
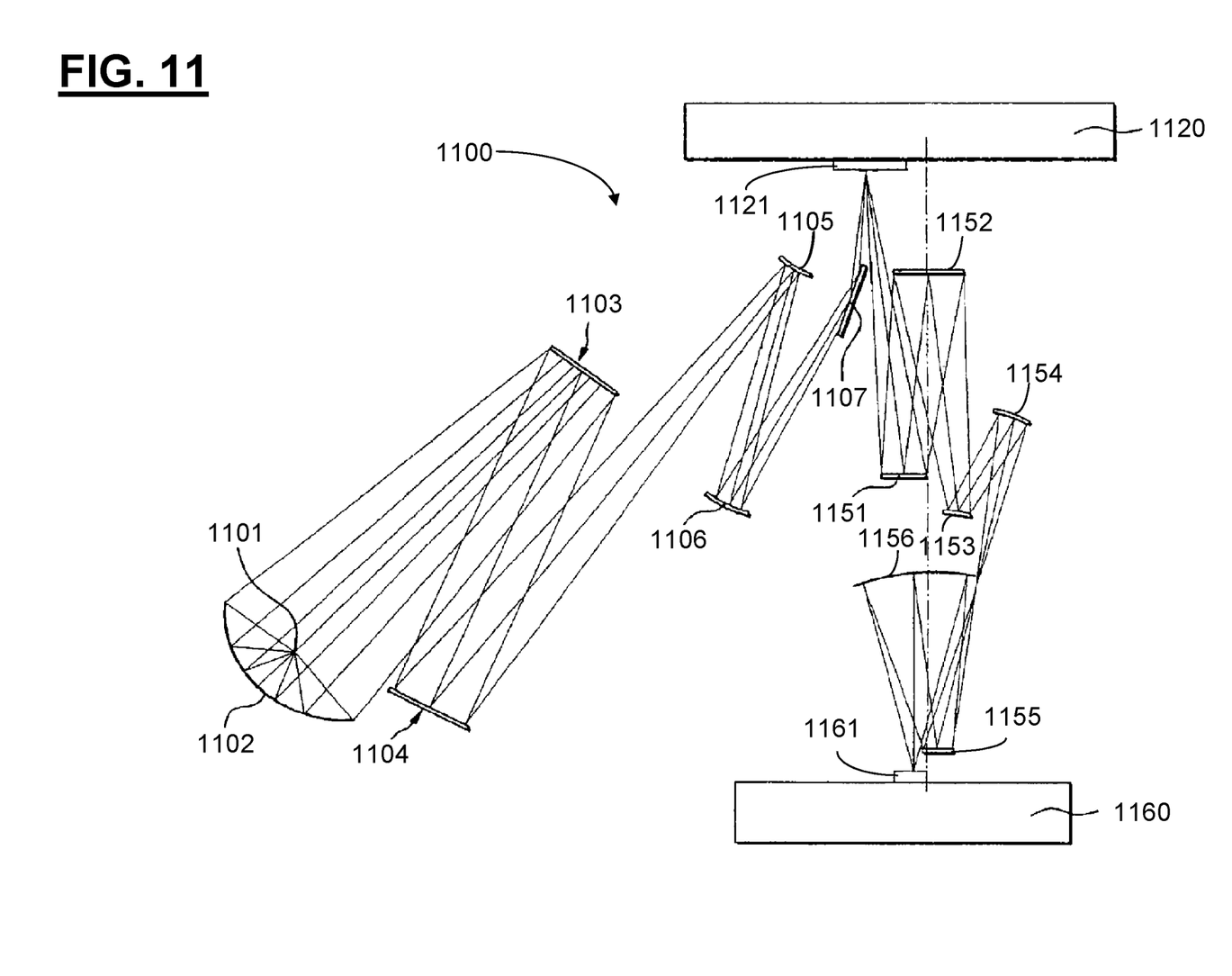
FIG. 11 shows a schematic illustration to explain the possible construction of a microlithographic projection exposure apparatus designed for operation in the EUV.

FIG. 11 shows a schematic illustration of an exemplary projection exposure apparatus 1100 designed for operation in the EUV.

According to FIG. 11, an illumination device of this projection exposure apparatus 1100 has a field facet mirror 1103 and a pupil facet mirror 1104. All of the mirrors in the projection exposure apparatus 1100 can be free-form surfaces. The light from a light source unit comprising a plasma light source 1101 and a collector mirror 1102 is directed at the field facet mirror 1103. A first telescope mirror 1105 and a second telescope mirror 1106 are arranged downstream of the pupil facet mirror 1104 in the light path. Arranged downstream in the light path is a deflection mirror 1107, which directs the radiation incident on it at an object field in the object plane of a projection lens comprising six mirrors 1151-1156. At the location of the object field, a reflective structure-bearing mask 1121 is arranged on a mask stage 1120 and with the aid of the projection lens is imaged into an image plane, in which a substrate 1161 coated with a light-sensitive layer (photoresist) is situated on a wafer stage 1160.

The element to be damped with regard to vibrations according to the present disclosure can be, for example, any of the mirrors 1151-1156 of the projection lens.

Even though the disclosure has been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are also encompassed by the present disclosure, and the scope of the disclosure is limited only within the meaning of the appended patent claims and the equivalents thereof.

What is claimed is:

1. A damping arrangement, comprising:
a first element comprising an interior defining a cavity;
a fluid located in the cavity of the first element; and
a second element different from the first element, the second element being spaced from the first element, the second element comprising an interior, the interior of the second element defining a channel connected to the cavity of the first element,
wherein the damping arrangement is configured so that a vibration of the first element causes vibration energy of the first element to be dissipated by partial displacement of the fluid from the cavity of the first element into the channel of the second element.

2. The damping arrangement of claim 1, further comprising an auxiliary mass within the cavity of the first element, wherein the auxiliary mass is configured to partially displace the fluid into the channel of the second element when the first element vibrates.

3. The damping arrangement of claim 2, wherein the auxiliary mass is stably mounted with respect to the first element.

4. The damping arrangement of claim 3, wherein the stable mounting of the auxiliary mass has a resonant frequency that matches a resonant frequency of the first element.

5. The damping arrangement of claim 1, wherein the damping arrangement is configured to dampen a resonant frequency of the first element of more than 50 Hz.

6. The damping arrangement of claim 1, further comprising a plurality of auxiliary masses within the cavity of the first element, wherein the auxiliary masses are configured to partially displace the fluid into the channel of the second element when the first element vibrates.

7. The damping arrangement of claim 1, wherein the channel of the second element is configured so that the fluid cools the first element.

8. The damping arrangement of claim 1, wherein the channel of the second element comprises regions having a meandering geometry.

9. The damping arrangement of claim 1, further comprising at least one member selected from the group consisting of a magnet and a coil, wherein the damping arrangement is configured so that, when an electric current is supplied to the member, the viscosity of the fluid changes.

10. The damping arrangement of claim 1, wherein the first element comprises an optical element.

11. The damping arrangement of claim 1, wherein the first element comprises a mirror.

12. A system, comprising:
a damping arrangement according to claim 1,
wherein the first element comprises an optical element, and the system is a microlithographic projection exposure apparatus.

13. The system of claim 12, wherein the projection exposure apparatus has an operating wavelength of less than 30 nm.

14. The system of claim 12, wherein the optical element comprises a mirror.

15. A system, comprising:
an optical element comprising a cavity;
a fluid located in the cavity of the optical element; and
a second element different from the optical element, the second element being spaced apart from the optical element, the second element comprising an interior, the interior of the second element defining a channel connected to the cavity of the optical element,
wherein:
the damping arrangement is configured so that a vibration of the optical element causes vibration energy of the optical element to be dissipated by partial displacement of the fluid from the cavity of the optical element into the channel of the second element; and
the system is a microlithographic projection exposure apparatus.

16. A damping arrangement, comprising:
a first element comprising an interior defining a cavity;
a fluid located in the cavity of the first element;
a second element different from the first element, the second element being spaced from the first element, the second element comprising an interior, the interior of the second element defining a channel connected to the cavity of the first element; and
a third element different from both the first and second elements,
wherein the damping arrangement is configured so that a vibration of the third element causes vibration energy of the third element to be dissipated by partial displacement of the fluid from the cavity of the first element into the channel of the second element.

17. The damping arrangement of claim 16, wherein the third element comprises a member selected from the group consisting of an optical element, an actuator configured to actuate an optical element, a joint element, a supporting frame and a measurement frame.

18. The damping arrangement of claim 17, wherein the third element comprises a mirror.

19. The damping arrangement of claim 16, wherein the third element comprises a mirror.

20. A system, comprising:
a damping arrangement according to claim 16,
wherein:
the third element comprises a member selected from the group consisting of an optical element, an actuator configured to actuate an optical element, a joint element, a supporting frame and a measurement frame; and
the system is a microlithographic projection exposure apparatus.

21. The system of claim 20, wherein the projection exposure apparatus has an operating wavelength of less than 30 nm.

22. The system of claim 20, wherein the optical element comprises a mirror.

* * * * *

UNITED STATES PATENT AND TRADEMARK OFFICE
CERTIFICATE OF CORRECTION

| | |
|---|---|
| PATENT NO. | : 12,287,587 B2 |
| APPLICATION NO. | : 17/983070 |
| DATED | : April 29, 2025 |
| INVENTOR(S) | : Marwene Nefzi et al. |

It is certified that error appears in the above-identified patent and that said Letters Patent is hereby corrected as shown below:

In the Specification

Column 6, Line 20, delete "$1*0^4$ Pa s" and insert -- $1*10^4$ Pa s --.

Column 7, Line 23, after "for" delete "to".

Signed and Sealed this
Twenty-fourth Day of June, 2025

Coke Morgan Stewart
*Acting Director of the United States Patent and Trademark Office*